United States Patent
Park et al.

(10) Patent No.: US 9,991,897 B1
(45) Date of Patent: Jun. 5, 2018

(54) SAMPLING PHASE-LOCKED LOOP (PLL)

(71) Applicant: QUALCOMM Incorporated, San Diego, CA (US)

(72) Inventors: Dongmin Park, San Diego, CA (US); Jong Min Park, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/415,201

(22) Filed: Jan. 25, 2017

(51) Int. Cl.
*H03L 7/08* (2006.01)
*H03L 7/091* (2006.01)
*H03L 7/099* (2006.01)
*H04L 7/033* (2006.01)

(52) U.S. Cl.
CPC .............. *H03L 7/091* (2013.01); *H03L 7/099* (2013.01); *H04L 7/0331* (2013.01)

(58) Field of Classification Search
CPC ........ H03L 7/091; H03L 7/099; H03L 7/0331
USPC ................................................. 327/152–160
See application file for complete search history.

(56) References Cited

U.S. PATENT DOCUMENTS

| | | | | |
|---|---|---|---|---|
| 4,868,523 A | * | 9/1989 | Petersson | H03L 7/199 331/14 |
| 5,061,904 A | * | 10/1991 | Mantopoulos | H03L 7/091 331/14 |
| 5,107,227 A | * | 4/1992 | Brooks | H03L 7/099 331/17 |
| 5,682,113 A | * | 10/1997 | Park | H03K 5/04 327/174 |
| 5,694,088 A | | 12/1997 | Dickson | |
| 6,188,206 B1 | | 2/2001 | Nguyen et al. | |
| 6,222,895 B1 | | 4/2001 | Larsson | |
| 6,262,610 B1 | | 7/2001 | Lo et al. | |
| 6,366,069 B1 | | 4/2002 | Nguyen et al. | |
| 7,598,816 B2 | | 10/2009 | Agarwal et al. | |
| 7,737,743 B1 | | 6/2010 | Gao et al. | |
| 8,085,020 B1 | | 12/2011 | Bennett | |
| 8,427,209 B2 | * | 4/2013 | Gao | H03L 7/091 327/147 |
| 9,608,644 B1 | | 3/2017 | Raj et al. | |
| 9,660,655 B2 | * | 5/2017 | Josefsberg | H03L 7/07 |
| 2015/0277460 A1 | | 10/2015 | Liu et al. | |

(Continued)

OTHER PUBLICATIONS

Hsu C-W., et al., "A Sub-Sampling-Assisted Phase-Frequency Detector for Low-Noise PLLs With Robust Operation Under Supply Interference", IEEE Transactions on Circuits and Systems-I: Regular Papers, vol. 62, No. 1, Jan. 2015, pp. 90-99.

(Continued)

*Primary Examiner* — Dinh T Le
(74) *Attorney, Agent, or Firm* — Patterson & Sheridan, L.L.P. Qualcomm

(57) ABSTRACT

Certain aspects of the present disclosure generally relate to methods and apparatus for generating oscillating signals. For example, certain aspects of the present disclosure provide a phase-locked loop (PLL) having a first switch coupled to a sampling input node of the PLL, an integrator coupled to an output of the sampling circuit, and a voltage-controlled oscillator (VCO) having an input coupled to an output of the integrator. In certain aspects, the PLL may also include a feedback path coupled to an output of the VCO and a control input of the first switch.

23 Claims, 6 Drawing Sheets

(56) References Cited

U.S. PATENT DOCUMENTS

2016/0268904 A1   9/2016   Melendy et al.
2017/0090501 A1   3/2017   Fletcher et al.

OTHER PUBLICATIONS

Gao X., et al., "A Low Noise Sub-Sampling PLL in Which Divider Noise is Eliminated and PD/CP Noise is Not Multiplied by $N^2$", IEEE Journal of Solid-State Circuits, vol. 44, No. 12, Dec. 2009, pp. 3253-3263.
Huang M-H., et al., "Single-Inductor Multi-Output (SIMO) DC-DC Converters with High Light-Load Efficiency and Minimized Cross-Regulation for Portable Devices", IEEE Journal of Solid-State Circuits, vol. 44, No. 4, Apr. 2009, pp. 1099-1111.
Gao X., et al., "A 2.7-to-4.3GHz, 0.16psrms-Jitter, -246.8dB-FOM, Digital Fractional-N Sampling PLL in 28nm CMOS", 2016 IEEE International Solid-State Circuits Conference (ISSCC), Feb. 2, 2016, 3 pages.

\* cited by examiner

SAMPLING PHASE-LOCKED LOOP (PLL)

TECHNICAL FIELD

Certain aspects of the present disclosure generally relate to electronic circuits and, more particularly, to a phase-locked loop (PLL) circuit.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. MSs and BSs may include one or more frequency synthesizers that generate oscillating signals to be used for reception and transmission of signals. A frequency synthesizer may generate an oscillating signal using a voltage-controlled oscillator (VCO). The VCO may be part of a phase-locked loop (PLL) that locks the phase of the oscillating signal generated by the VCO to a phase of a reference signal.

SUMMARY

Certain aspects of the present disclosure generally relate to generating an oscillating signal.

Certain aspects of the present disclosure provide a phase-locked loop (PLL). The PLL generally includes a sampling circuit having a first switch coupled to a sampling input node of the PLL, an integrator coupled to an output of the sampling circuit, a voltage-controlled oscillator (VCO) having an input coupled to an output of the integrator, and a feedback path coupled to an output of the VCO and a control input of the first switch.

Certain aspects of the present disclosure provide a PLL. The PLL generally includes a first transistor coupled to a reference potential, an impedance coupled to the first transistor, the first transistor having a gate coupled to a reference frequency node, a sampling circuit comprising a first switch coupled to the impedance, a sampling capacitor coupled to the first switch, and a second switch coupled to the sampling capacitor, an integrator coupled to the second switch, and a VCO coupled to the integrator.

Certain aspects of the present disclosure provide a method for generating an oscillating signal. The method generally includes selectively sampling an input voltage based on a feedback signal, integrating the sampled input voltage to generate a control voltage, generating the oscillating signal based on the control voltage, and generating the feedback signal based on the oscillating signal.

Certain aspects of the present disclosure provide an apparatus for generating an oscillating signal. The apparatus generally includes means for selectively sampling an input voltage based on a feedback signal, means for integrating the sampled input voltage to generate a control voltage, means for generating the oscillating signal based on the control voltage, and means for generating the feedback signal based on the oscillating signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
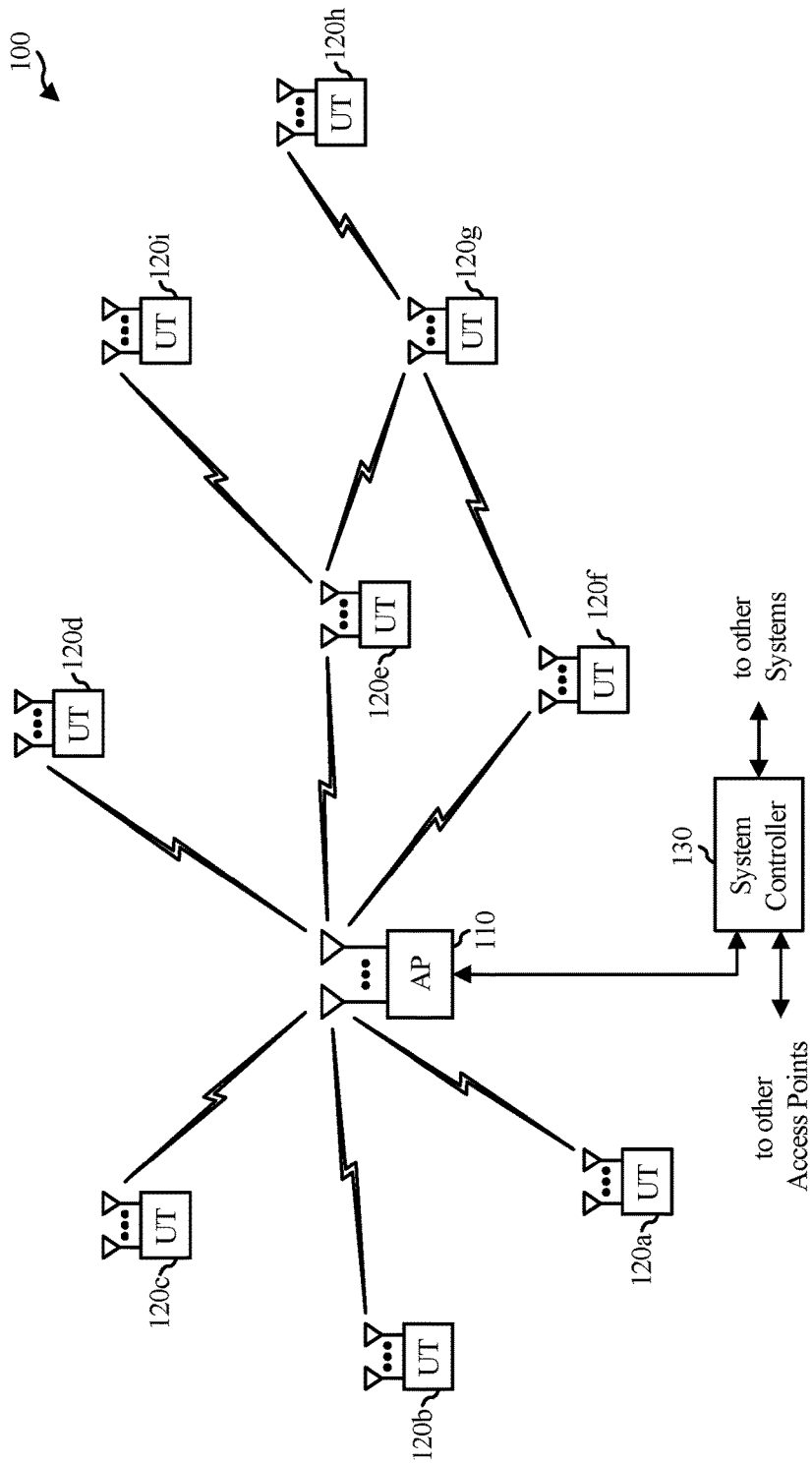
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art.

Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported). In certain aspects of the present disclosure, the access point 110 and/or user terminal 120 may include a phase-locked loop (PLL), as described in more detail herein.

Figure 2:
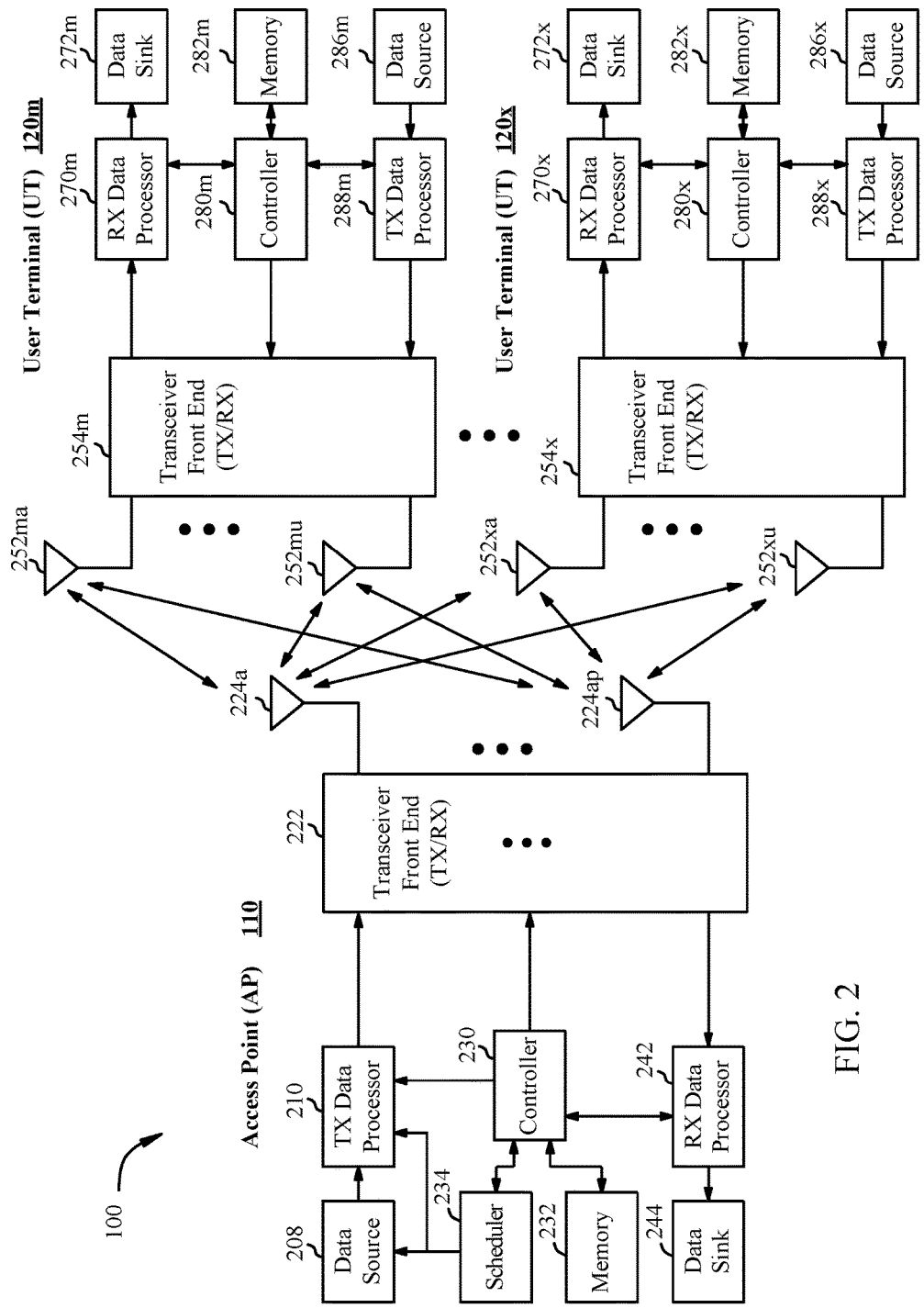
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX)254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a phase-locked loop, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
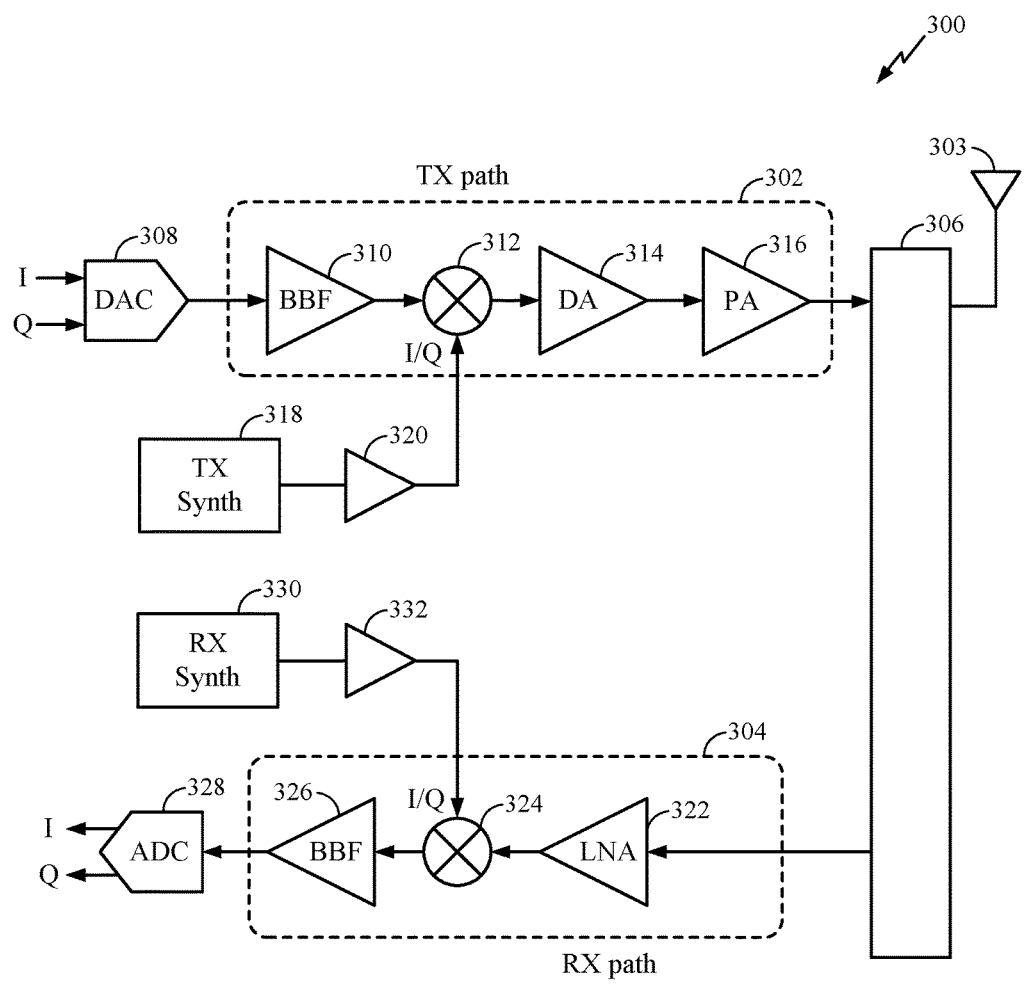
FIG. 3 is a block diagram of an example transceiver front end, in accordance with certain aspects of the present disclosure.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit LO signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive LO signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects the TX synthesizer and the RX synthesizer 330 may include a PLL, as described in more detail herein.

Example Sampling Phase-Locked Loop (PLL)

Generally, a phase-locked loop (PLL) may be used to generate an oscillating signal having a phase that corresponds to a phase of a reference signal. In some cases, a PLL may be implemented using a charge pump. A charge pump is a circuit used to convert a voltage by charging and discharging a capacitor. However, the charge pump may contribute noise to the oscillating signal generated by the PLL. While the noise contribution of the charge pump may be reduced by increasing the charge pump current, increasing the charge pump current may result in increased power consumption and area overhead.

In some cases, a PLL may include a sampling charge pump which has high phase detection gain, and hence, suppresses noise from other stages of the PLL. However, due to the high gain associated with the sampling charge pump, the loop bandwidth control of the PLL may become challenging over process, voltage, and temperate (PVT) variations. Aspects of the present disclosure are generally directed to a PLL having a gain that is less susceptible to variations in PVT.

Figure 4:
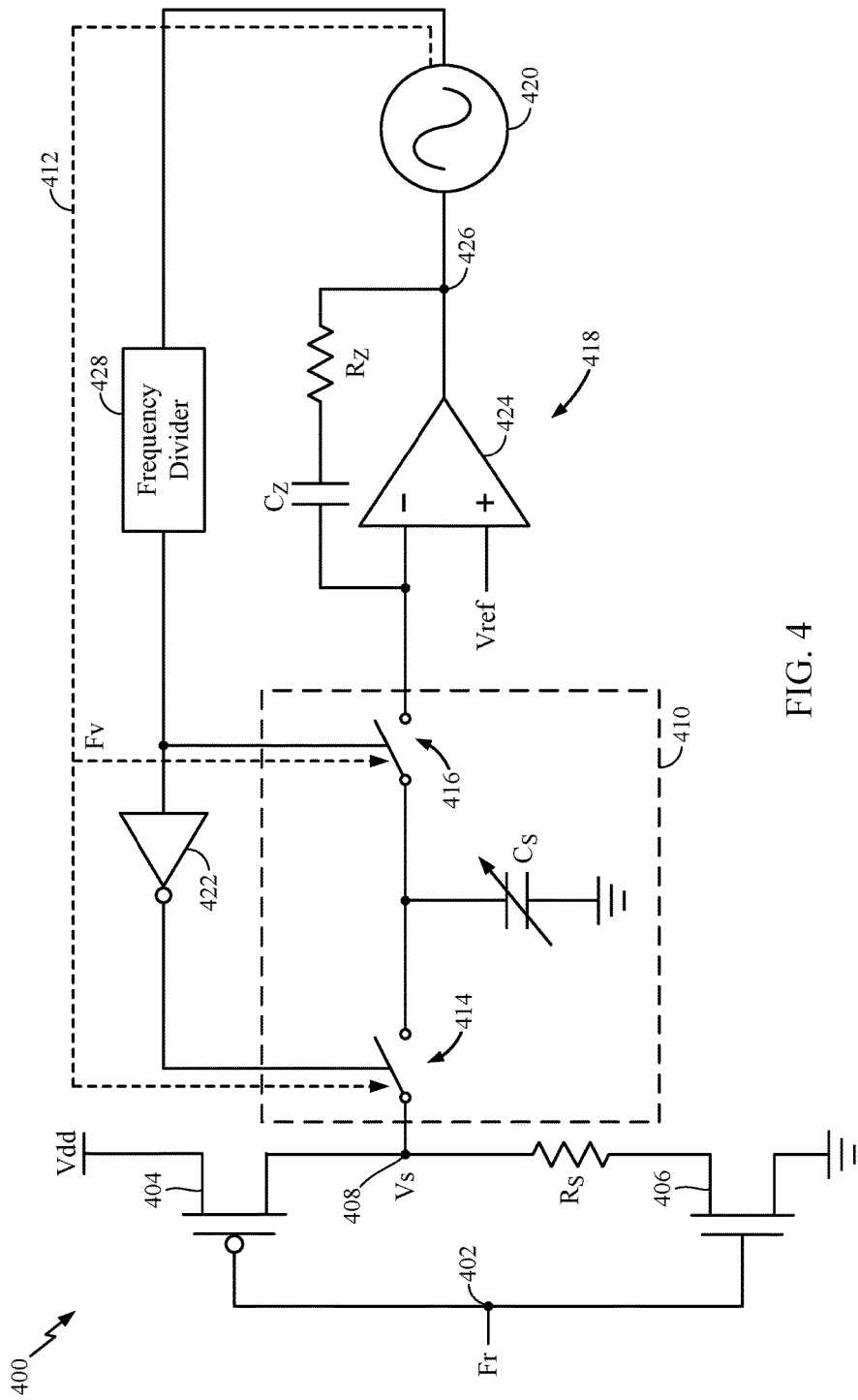
FIG. 4 illustrates an example phase-locked loop (PLL), in accordance with certain aspects of the present disclosure.

FIG. 4 illustrates a PLL 400, in accordance with certain aspects of the present disclosure. As illustrated, the PLL 400 may receive a reference frequency signal (Fr) at node 402. The node 402 may be coupled to a gate of a p-channel metal-oxide semiconductor (PMOS) transistor 404 and a gate of an n-channel metal-oxide semiconductor (NMOS) transistor 406. A source of the PMOS transistor 404 may be coupled to a voltage rail (e.g., Vdd as shown), and a source of the NMOS transistor 406 may be coupled to a reference potential (e.g., ground potential).

In certain aspects, a node 408 may be coupled to the transistor 406 through an impedance (e.g., resistor Rs). The node 408 may also be coupled to a sampling circuit 410. The voltage Vs at node 408 may be sampled by the sampling circuit 410 based on a feedback signal through a feedback path 412. For example, the sampling circuit 410 may include a switch 414 coupled between node 408 and a sampling capacitor Cs. The sampling voltage Vs is sampled by the sampling capacitor Cs when the switch 414 is closed. The sampling circuit 410 may also include a switch 416 coupled to an integrator 418. Thus, the integrator may sense the voltage across the sampling capacitor Cs when the switch 416 is closed. The integrator 418 may include an amplifier 424 (e.g., an operational amplifier, or op amp) having a first input (e.g., positive input) coupled to a reference voltage Vref (e.g., reference voltage source), and a second input (e.g., negative input) coupled to the sampling circuit 410 (e.g., to the switch 416). The integrator also includes an impedance (e.g., a capacitor Cz connected in series with a resistor Rz) coupled between the output of the amplifier 424 and the second input of the amplifier 424. The output of the amplifier 424 may also be coupled to an input of a voltage-controlled oscillator (VCO) 420 and may be used as the tuning voltage for the VCO.

The switches 414 and 416 may be controlled based on a feedback frequency signal (Fv) generated based on an oscillating signal generated by the VCO 420. In some cases, the feedback frequency signal Fv may be generated by frequency dividing the oscillating signal output by the VCO 420 via a frequency divider 428. As illustrated, the switch 416 may be controlled by the feedback frequency signal Fv, and the switch 414 may be controlled by an inverse of the feedback frequency signal Fv. In certain aspects, an inverter 422 may be used to generate the inverse of the feedback frequency signal Fv. The operations of the PLL 400 are described in more detail with respect to FIG. 5.

Figure 5:
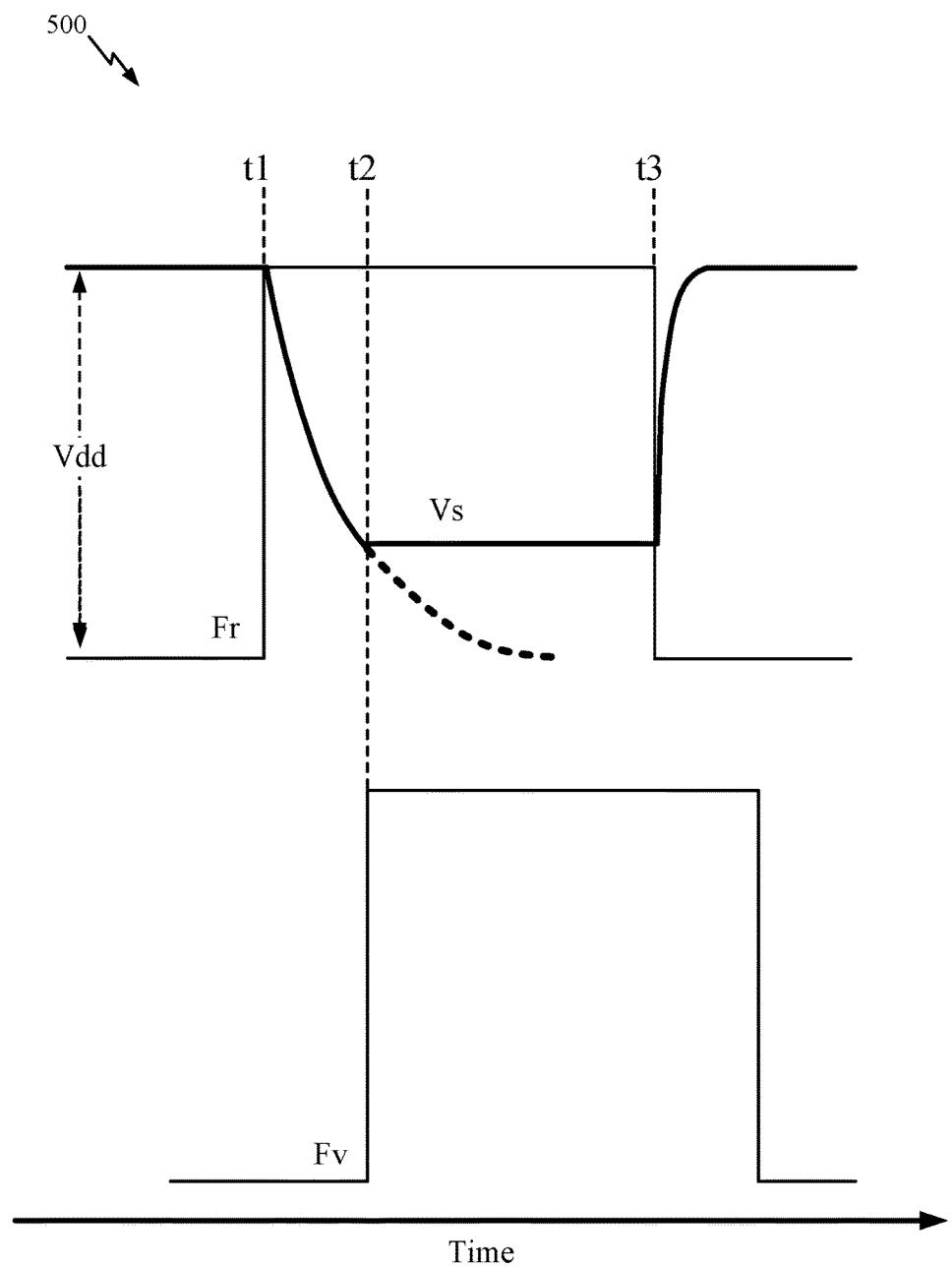
FIG. 5 is a graph of example signals generated by the PLL of FIG. 4, in accordance with certain aspects of the present disclosure.

FIG. 5 is a graph 500 of the reference frequency signal Fr, the feedback frequency signal Fv, and the sampling voltage Vs, in accordance with certain aspects of the present disclosure. The graph 500 illustrates a scenario where the phases of the feedback frequency signal Fv and the reference frequency signal Fr are not the same (i.e., the PLL 400 is not phase-locked). For example, the rising edge of reference frequency signal Fr occurs at time t1 and the rising edge of the feedback frequency signal Fv occurs at time t2. Just prior to time t1, switch 404 is closed, coupling the node 408 to the voltage rail Vdd. Moreover, switch 414 may be closed, and switch 416 may be open. Thus, at time t1, the sampling voltage Vs may be equal (or very close) to Vdd. When the reference frequency signal Fr goes high at time t1, transistor 404 opens and transistor 406 closes, coupling the node 408 to the reference potential through the resistor Rs. Thus, sampling voltage Vs is discharged through the resistor Rs to the reference potential, until switch 414 opens at time t2 (due to the feedback frequency signal Fv going high). For example, at time t2, the feedback frequency signal Fv goes high, resulting in the output of the inverter 422 going low, thus, opening the switch 414. The discharge rate of the sampling voltage Vs between time t1 and time t2 is based on a resistor-capacitor (RC) time constant formed by the sampling capacitor Cs and the resistor Rs. Thus, assuming that the sampling voltage Vs is charged to Vdd at time t1 when the transistor 406 closes, the discharge rate of the sampling voltage Vs may be characterized by the following equation:

$$V_S = V_{DD} e^{-\frac{t}{RC}}$$

As illustrated, the longer the time period between time t1 and time t2, the more the sampling voltage Vs will discharge during this time period. At time t2, the feedback frequency signal Fv goes high, closing switch 416 (and the output of inverter 422 goes low, opening switch 414). Thus, the sampling voltage Vs across the sampling capacitor Cs is sensed by the integrator 418 at time t2. Based on the sensed sampling voltage Vs, the integrator adjusts the tuning voltage of the VCO 420 at node 426. At time t3, the reference frequency signal Fr transitions from logic high to logic low, opening transistor 406, and closing transistor 404. Thus, the voltage Vs is charged to Vdd at time t3, as illustrated. In certain aspects, the reference voltage Vref supplied to the integrator 418 may be equal to half of the Vdd voltage.

The time difference between times t1 and t2 corresponds to the phase offset between the reference frequency signal Fr and the feedback frequency signal Fv. Thus, as the phase offset between the reference frequency signal Fr and the feedback frequency signal Fv increases, the output of the integrator (e.g., the tuning voltage of the VCO) decreases, such that the phases of the reference frequency signal Fr and the feedback frequency signal Fv can be matched.

The gain (A) (e.g., loop transfer function) of the PLL of FIG. 4 may be represented by the following equation in the frequency domain:

$$A = \frac{V_{ref}}{2\pi} \frac{R_Z}{R_S} \frac{K_{vco}/N}{s}$$

where N is the frequency division factor of the frequency divider 428, $K_{vco}$ is the gain coefficient of the VCO 420, Rz is the resistance of the resistor Rz, Rs is the resistance of resistor Rs, Vref is the reference voltage applied to the positive input terminal of amplifier 424, and s is a complex number frequency parameter of the Laplace transform. As illustrated by the equation, variations in the gain (A) of the PLL of FIG. 4 is dependent on the ratio between the resistance values of Rz and Rs. Since the ratio between Rz and Rs is more easily controlled than the individual resistances, the PLL of FIG. 4 is less susceptible to variations over PVT. Moreover, as shown by the above equation, the loop transfer function of the PLL of FIG. 4 is independent from a capacitance of the sampling capacitor Cs.

Figure 6:
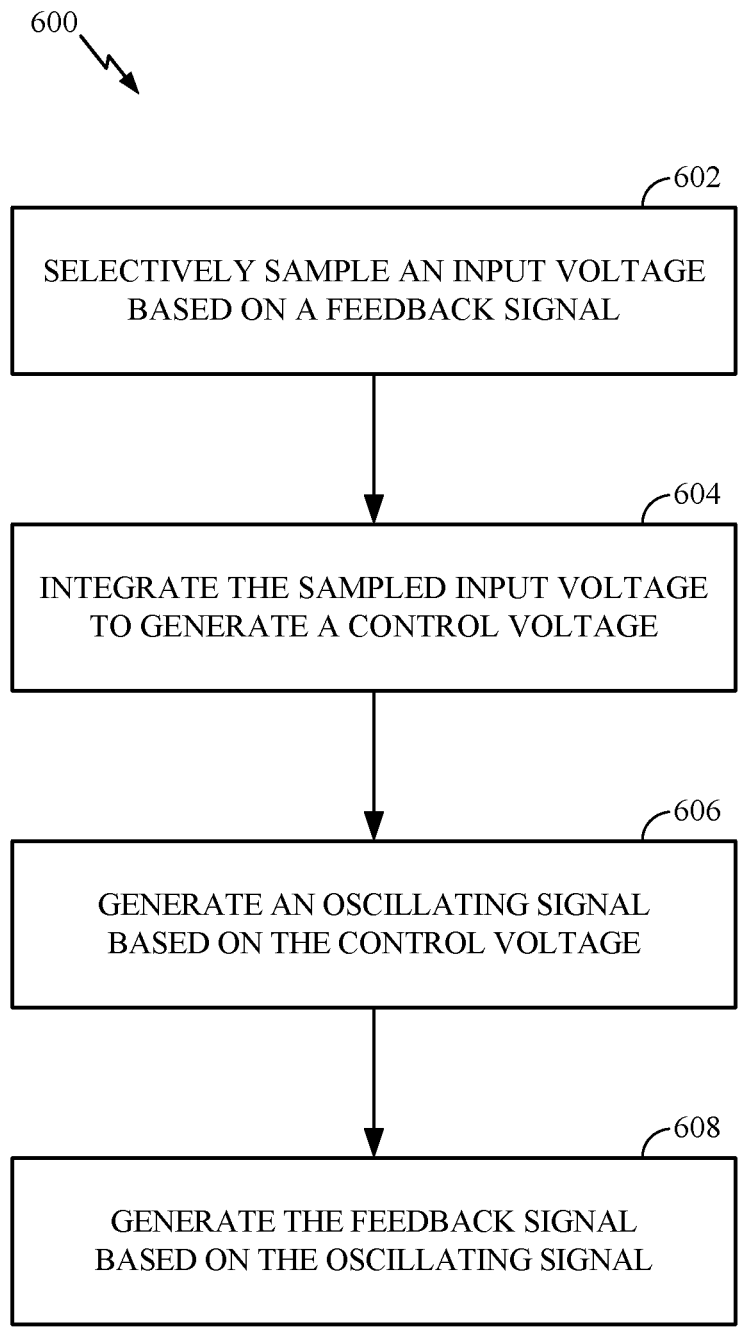
FIG. 6 is a flow diagram of example operations for generating an oscillating signal, in accordance with certain aspects of the present disclosure.

FIG. 6 is a flow diagram of example operations 600 for generating an oscillating signal, in accordance with certain aspects of the present disclosure. The operations 600 may be performed by a circuit, such as the PLL 400 of FIG. 4.

The operations 600 may begin, at block 602, by selectively sampling an input voltage (e.g., voltage Vs) based on a feedback signal, and at block 604, integrating (e.g., via integrator 418) the sampled input voltage to generate a control voltage (e.g., tuning voltage at node 426). At block 606, the oscillating signal may be generated (e.g., via the VCO 420) based on the control voltage, and at block 608, the feedback signal may be generated based on the oscillating signal.

In certain aspects, selectively sampling the input voltage at block 602 may include selectively coupling (e.g., via switch 414) an input voltage node (e.g., node 408) providing the input voltage to a capacitor (e.g., capacitor Cs) and selectively coupling (e.g., via switch 416) the capacitor to an integrator (e.g., integrator 418) used for the integration of the sampled input voltage. In certain aspects, selectively coupling the input voltage node to the capacitor is performed during a first time interval and selectively coupling the capacitor to the integrator is performed during a second time interval, wherein the first time interval is different from the second time interval.

In certain aspects, the generating the feedback signal comprises inverting (e.g., via invertor 422) another feedback signal and the input voltage node may be selectively coupled to the capacitor based on the feedback signal. In certain aspects, the capacitor is selectively coupled to the integrator based on the other feedback signal. In certain aspects, generating the feedback signal may include frequency dividing (e.g., frequency divider 428) the oscillating signal to generate the other feedback signal.

In certain aspects, the operations 600 may also include coupling an input voltage node (e.g., node 408) providing the input voltage to a reference potential through an impedance (e.g., Rs) during a first period, and coupling the input voltage node to a voltage rail (e.g., Vdd) during a second period. In some cases, the first period and the second period correspond to a frequency of a reference signal (e.g., reference frequency signal Fr). For example, the first period may correspond to a time between the rising edge of the reference signal and the falling edge of the reference signal, and the second period may correspond to a time between the falling edge of the reference signal and the rising edge of the reference signal. In certain aspects, generating the feedback signal comprises dividing a frequency of the oscillating signal (e.g., via frequency divider 428).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for selectively sampling may comprise a switch, such as the switch 414 of FIG. 4. Means for integrating may comprise an integrator, such as the integrator 418 of FIG. 4. Means for generating may include a VCO, such as the VCO 420, or a frequency divider, such as the frequency divider 428.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A phase-locked loop (PLL) comprising:
a sampling circuit having a first switch coupled to a sampling input node of the PLL;
an integrator coupled to an output of the sampling circuit, the sampling circuit comprising a capacitor coupled to the first switch, and a second switch coupled between the capacitor and an input of the integrator;
a voltage-controlled oscillator (VCO) having an input coupled to an output of the integrator; and
a feedback path coupled to an output of the VCO and control inputs of the first switch and the second switch, wherein the feedback path comprises an inverter, wherein the control input of the second switch is coupled to an input of the inverter, and wherein the control input of the first switch is coupled to an output of the inverter.

2. The PLL of claim 1, further comprising an impedance coupled to the first switch and selectively coupled to a reference potential of the PLL.

3. The PLL of claim 2, wherein the impedance is selectively coupled to the reference potential through a transistor having a gate coupled to a reference frequency node.

4. The PLL of claim 1, wherein the first switch is closed when the second switch is open and the second switch is closed when the first switch is open.

5. The PLL of claim 4, wherein the feedback path further comprises a frequency divider coupled between the input of the inverter and the output of the VCO.

6. The PLL of claim 1, wherein the integrator comprises:
an amplifier having a first input coupled to the second switch, a second input coupled to a reference voltage source, and an output coupled to the input of the VCO; and
an impedance coupled between the first input of the amplifier and the output of the amplifier.

7. The PLL of claim 6, wherein the impedance comprises a resistor and a capacitor.

8. The PLL of claim 7, wherein the resistor and capacitor are coupled in series.

9. The PLL of claim 1, wherein a loop transfer function of the PLL is independent from a capacitance of the capacitor.

10. The PLL of claim 1, further comprising:
a first transistor coupled to a voltage rail;
a second transistor coupled to a reference potential, wherein gates of the first transistor and the second transistor are coupled to a reference frequency node; and
an impedance coupled between drains of the first transistor and the second transistor, wherein a drain of the first transistor is coupled to the sampling input node.

11. A phase-locked loop (PLL) comprising:
a first transistor coupled to a reference potential node;
an impedance coupled to the first transistor, the first transistor having a gate coupled to a reference frequency node;
a sampling circuit comprising a first switch coupled to the impedance, a sampling capacitor coupled to the first switch, and a second switch coupled to the sampling capacitor;
an integrator coupled to the second switch; and
a voltage-controlled oscillator (VCO) coupled to the integrator, wherein control inputs of the first switch and the second switch are coupled to a feedback path, the feedback path being coupled to an output of the VCO, wherein the feedback path comprises an inverter, wherein the control input of the second switch is coupled to an input of the inverter, and wherein the control input of the first switch is coupled to an output of the inverter.

12. The PLL of claim 11, wherein the feedback path further comprises a frequency divider coupled between the input of the inverter and the output of the VCO.

13. The PLL of claim 11, wherein the integrator comprises:
an amplifier having a first input coupled to the second switch, a second input coupled to a reference voltage source, and an output coupled to an input of the VCO; and
an impedance coupled between the first input of the amplifier and the output of the amplifier.

14. The PLL of claim 13, wherein the impedance comprises a resistor and a capacitor.

15. The PLL of claim 14, wherein the resistor and capacitor are coupled in series.

16. The PLL of claim 11, further comprising a second transistor coupled between a voltage rail and the sampling circuit, the second transistor comprising a gate coupled to the reference frequency node.

17. A method for generating an oscillating signal, comprising:
    selectively sampling an input voltage based on a feedback signal;
    integrating the sampled input voltage to generate a control voltage, wherein selectively sampling the input voltage comprises selectively coupling an input voltage node providing the input voltage to a capacitor during a first time interval, and selectively coupling the capacitor to an integrator used for the integration of the sampled input voltage during a second time interval, the first time interval being different than the second time interval;
    generating the oscillating signal based on the control voltage; and
    generating the feedback signal based on the oscillating signal.

18. The method of claim 17, wherein:
    generating the feedback signal comprises inverting another feedback signal;
    the input voltage node is selectively coupled to the capacitor based on the feedback signal; and
    the capacitor is selectively coupled to the integrator based on the other feedback signal.

19. The method of claim 18, wherein generating the feedback signal further comprises frequency dividing the oscillating signal to generate the other feedback signal.

20. The method of claim 17, further comprising:
    coupling an input voltage node providing the input voltage to a reference potential node through an impedance during a first period; and
    coupling the input voltage node to a voltage rail during a second period.

21. The method of claim 20, wherein the first period and the second period correspond to a frequency of a reference signal.

22. The method of claim 17, wherein generating the feedback signal comprises dividing a frequency of the oscillating signal.

23. An apparatus for generating an oscillating signal, comprising:
    means for selectively sampling an input voltage based on a feedback signal;
    means for integrating the sampled input voltage to generate a control voltage, wherein the means for selectively sampling the input voltage comprises means for selectively coupling an input voltage node providing the input voltage to a capacitor during a first time interval, and means for selectively coupling the capacitor to the means for integrating during a second time interval, the first time interval being different than the second time interval;
    means for generating the oscillating signal based on the control voltage; and
    means for generating the feedback signal based on the oscillating signal.

* * * * *